(12) United States Patent
Fujii

(10) Patent No.: US 6,229,505 B1
(45) Date of Patent: May 8, 2001

(54) ORGANIC ELECTROLUMINESCENT DEVICE AND ORGANIC ELECTROLUMINESCENT APPARATUS

(75) Inventor: Hiroyuki Fujii, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/212,394

(22) Filed: Dec. 16, 1998

(30) Foreign Application Priority Data

Dec. 17, 1997 (JP) .................................................... 9-347512

(51) Int. Cl.[7] ...................................................... G09G 3/30
(52) U.S. Cl. ........................... 345/76; 345/77; 315/169.3; 313/504
(58) Field of Search ..................... 345/76, 77; 315/169.3; 313/504, 507

(56) References Cited

U.S. PATENT DOCUMENTS 6,091,382 * 7/2000 Shioya et al. ........................... 345/76

FOREIGN PATENT DOCUMENTS 6-93257    4/1994 (JP) .

OTHER PUBLICATIONS

*Extended Abstracts of 9th International Workshop on Inorganic and Organic Electroluminescence*, Bend, Oregon, Sep. 14–17, 1998, pp. 13–16 and pp. 155–158.

* cited by examiner

Primary Examiner—Kiet T. Nguyen
(74) Attorney, Agent, or Firm—Armstrong, Westerman, Hattori, McLeland & Naughton LLP

(57) ABSTRACT

An organic electroluminescent apparatus according to the present invention has an organic electroluminescent device provided with an organic layer including luminescent materials in which the emission spectrum varies depending on a voltage of an electric signal between a hole injection electrode and an electron injection electrode and voltage applying means for applying a voltage of an electric signal in a pulse shape between the hole injection electrode and the electron injection electrode, the voltage applying means changing the voltage amplitude of the electric signal in a pulse shape applied between the hole injection electrode and the electron injection electrode, to change the emission spectrum in the organic electroluminescent device.

20 Claims, 3 Drawing Sheets

ORGANIC ELECTROLUMINESCENT DEVICE AND ORGANIC ELECTROLUMINESCENT APPARATUS

BACKGROUND OF THE INVENTION

1. Field of the Invention

The present invention relates generally to an organic electroluminescent device having an organic layer including luminescent materials provided between a hole injection electrode and an electron injection electrode, and an organic electroluminescent apparatus using such an organic electroluminescent device. More particularly, it relates to an organic electroluminescent device capable of emitting light in various colors and an organic electroluminescent apparatus capable of simply changing the color of light emitted in the organic electroluminescent device and simply adjusting the luminance thereof.

2. Description of the Related Art

In recent years, the needs of flat panel display devices the consumed power and the size of which are smaller than those of a CRT (cathode-ray Tube) which has been conventionally generally employed have been increased as information equipments are diversified, for example. Therefore, an electroluminescent device has been paid attention to as one of the flat panel display devices.

The electroluminescent device is roughly divided into an inorganic electroluminescent device and an organic electroluminescent device depending on a used material.

The inorganic electroluminescent device is so adapted that a high electric field is generally exerted on a luminescent portion, and electrons are accelerated within the high electric field to collide with a luminescence center, so that the luminescence center is excited to emit light. On the other hand, the organic electroluminescent device is so adapted that electrons and holes are respectively injected into a luminescent portion from an electron injection electrode and a hole injection electrode, the electrons and the holes thus injected are recombined with each other to bring an organic molecule into its excited state, and the organic molecule emits fluorescence when it is returned from the excited state to its ground state.

In the case of the inorganic electroluminescent device, a high voltage of 100 to 200 volts is required as its driving voltage because a high electric field is exerted as described above. On the other hand, the organic electroluminescent device can be driven at a low voltage of approximately 5 to 20 volts.

Therefore, in recent years, various studies have been conducted on the organic electroluminescent device. A three-layer structure referred to as a DH structure obtained by laminating a hole transporting layer, a luminescent layer and an electron transporting layer between a hole injection electrode and an electron injection electrode, a two-layer structure referred to as an SH-A structure obtained by laminating a hole transporting layer and a luminescent layer abundant in electron transporting properties between a hole injection electrode and an electron injection electrode, and a two-layer structure referred to as an SH-B structure obtained by laminating a luminescent layer abundant in hole transporting properties and an electron transporting layer between a hole injection electrode and an electron injection electrode have been developed as the organic electroluminescent device.

The organic electroluminescent device can be caused to emit light in a suitable color by suitably selecting its luminescent material. Therefore, it is expected that the organic electroluminescent device can be also utilized as a multi-color display device, a full-color display device, and the like.

Conventionally when the organic electroluminescent device is caused to emit light, one organic electroluminescent device emits light in one type of color.

When multi-color or full-color display is performed using a conventional organic electroluminescent device, therefore, it is necessary to use a plurality of organic electroluminescent devices which differ in luminescent color in combination. When full-color display is performed, three types of organic electroluminescent devices emitting light in the three primary colors, that is, blue, green and red are used in combination.

In order to combine three types of organic electroluminescent devices to perform full-color display, however, three types of wiring for supplying a current to the organic electroluminescent devices must be provided, resulting in a complicated wiring method.

Since the three types of organic electroluminescent devices emitting light in blue, green and red are used as one unit to perform full-color display, the size of a pixel for performing full-color display is approximately three times a pixel in a single color. Therefore, it is difficult to display a highly precise full-color image particularly on a small-sized screen.

In recent years, in causing an organic electroluminescent device to emit light, a method of changing a voltage to be exerted on a portion between an electron injection electrode and a hole injection electrode in the organic electroluminescent device and a method of changing the duty ratio of a voltage to be applied have been proposed in order to adjust the luminance thereof.

In these methods, the luminance of light emitted from the organic electroluminescent device is merely adjusted, as described above. In one organic electroluminescent device, light in one type of color is only emitted. When multi-color or full-color display is performed, a plurality of organic electroluminescent devices which differ in luminescent color, as described above, must be used in combination, so that the above-mentioned problems still exist.

SUMMARY OF THE INVENTION

An object of the present invention is to make it possible to emit, when multi-color or full-color display is performed using an organic electroluminescent device having an organic layer including a luminescent material provided between a hole injection electrode and an electron injection electrode, light in various colors in one type of organic electroluminescent device.

Another object of the present invention is to make it possible to emit light in various colors in one type of organic electroluminescent device as well as to simply adjust the luminance thereof.

In a first organic electroluminescent device according to the present invention, in providing an organic layer including luminescent materials in which the emission spectrum varies depending on a voltage of an electric signal applied between a hole injection electrode and an electron injection electrode, used as said luminescent materials are luminescent materials comprising a luminescent material having carrier transporting properties and a luminescent material in which a peak on the longest wavelength side of the emission spectrum caused by excitation of ultraviolet lights exists on the longer wavelength side than that in the luminescent material having carrier transporting properties.

In a second organic electroluminescent device according to the present invention, in providing an organic layer including luminescent materials in which the emission spectrum varies depending on a voltage of an electric signal applied between a hole injection electrode and an electron injection electrode, used as said luminescent materials are luminescent materials comprising a luminescent material having electron transporting properties and a luminescent material in which the energy level of the lowest unoccupied molecular orbital (hereinafter referred to as LUMO) is lower than that in the luminescent material having electron transporting properties.

In each of the organic electroluminescent devices according to the present invention, when a voltage applied between the hole injection electrode and the electron injection electrode is changed, light is emitted in different colors from the organic electroluminescent devices depending on the value of the voltage.

Each of the organic electroluminescent devices may have any one of the DH structure, the SH-A structure, and the SH-B structure.

In each of the organic electroluminescent devices, it is preferable to use as the hole injection electrode an indium-tin oxide (hereinafter referred to as ITO), for example, having a large work function in order to efficiently inject holes into the organic layer. On the other hand, it is preferable to use as the electron injection electrode a magnesium-indium alloy or a lithium-aluminum alloy, for example, having a small work function in order to efficiently inject electrons into the organic layer.

As in the first organic electroluminescent device, when the luminescent material having carrier transporting properties and the luminescent material in which a peak on the longest wavelength side of the emission spectrum caused by excitation of ultraviolet lights exists on the longer wavelength side than that in the luminescent material having carrier transporting properties, it is preferable to use as a main component the luminescent material having carrier transporting properties such that the luminescent material having carrier transporting properties is excited by recombination of holes and electrons, while using as a sub-component the luminescent material in which the peak of the emission spectrum exists on the longer wavelength side than that in the luminescent material having carrier transporting properties.

In order that the luminescent material which is a sub-component is efficiently excited upon transfer of excitation energy from the luminescent material having carrier transporting properties to the luminescent material which is a sub-component, it is preferable that the difference in the peak wavelength on the longest wavelength side between the luminescent material having carrier transporting properties and the luminescent material which is a sub-component is not less than 100 nm. Further, it is preferable that the band gap of the luminescent material having carrier transporting properties is larger than the band gap of the luminescent material which is a sub-component, and the difference in the band gap therebetween is not less than 0.5 eV.

Consider a case where the luminescent material having carrier transporting properties is used as a main component, as described above, while the luminescent material in which the peak of the emission spectrum exists on the longer wavelength side than that in the luminescent material having carrier transporting properties is used as a sub-component. Generally in this case, the luminescent material having carrier transporting properties mainly emits light so that light having a short wavelength is emitted when a high voltage is applied, while the luminescent material which is a sub-component mainly emits light so that light having a long wavelength is emitted when a low voltage is applied.

On the other hand, when the luminescent material having electron transporting properties and the luminescent material which is higher in the energy level of LUMO, that is, lower in the energy level than the luminescent material having electron transporting properties are mixed with each other, the luminescent material having electron transporting properties is used as a main component, while the luminescent material at a low energy level is used as a sub-component.

In order that the luminescent material which is a sub-component is sufficiently excited and is sufficiently caused to emit light at a low voltage in a case where the luminescent material having electron transporting properties is used as a main component, while the luminescent material at a low energy level is used as a sub-component, it is preferable that the difference in the energy level of LUMO between the luminescent material having electron transporting properties which is a main component and the luminescent material which is a sub-component is not less than 0.3 eV such that electrons injected into the organic layer including the luminescent materials are absorbed in the luminescent material which is a sub-component rather than the luminescent material having electron transporting properties which is a main component.

When the luminescent material having electron transporting properties is used as a main component, while the luminescent material at a low energy level is used as a sub-component, as described above, the luminescent material having electron transporting properties which is a main component mainly emits light so that light having a short wavelength is emitted when a high voltage is applied, while the luminescent material which is a sub-component at a low energy level mainly emits light so that light having a long wavelength is emitted when a low voltage is applied.

Furthermore, in a case where a mixture of the plurality of luminescent materials is used as described above, when a luminescent material emitting light in green and a luminescent material emitting light in red are mixed with each other, light is emitted in a plurality of colors from green to red in accordance with a chromaticity diagram in one organic electroluminescent device. Therefore, full-color display is performed by combining the organic luminescent material with another organic electroluminescent device emitting light in blue.

A light emitting device emitting light in a different color is not limited to an organic electroluminescent device. It is also possible to use a light-emitting diode, an inorganic electroluminescent device, and other light emitting devices as the light emitting device emitting light in a different color.

The organic electroluminescent device according to the present invention has an organic electroluminescent device provided with an organic layer including a luminescent material in which the emission spectrum varies depending on a voltage of an electric signal between a hole injection electrode and an electron injection electrode, and voltage applying means for applying a voltage of an electric signal in a pulse shape between the hole injection electrode and the electron injection electrode, the voltage applying means changing the voltage amplitude of the electric signal in a pulse shape applied between the hole injection electrode and the electron injection electrode, to change the emission spectrum in the organic electroluminescent device.

The luminescent material used in the organic electroluminescent apparatus in the present invention may be one luminescent material in which the emission spectrum varies depending on a voltage of an electric signal applied between the hole injection electrode and the electron injection electrode or a mixture of a plurality of luminescent materials. For example, it is possible to use luminescent materials comprising a luminescent material having carrier transporting properties and a luminescent material in which a peak on the longest wavelength side of the emission spectrum caused by excitation of ultraviolet lights exists on the longer wavelength side than that in the luminescent material having carrier transporting properties, as in the first organic electroluminescent device, and luminescent materials comprising a luminescent material having electron transporting properties and a luminescent material in which the energy level of LUMO is lower than the energy level in the luminescent material having electron transporting properties, as in the second organic electroluminescent device.

It is preferable to use as the luminescent material a luminescent material composed of an organic compound having charges localized in a molecule, for example, a luminescent material having a cyclobuteneditium-1,3-diolate derivative, and a luminescent material composed of various types of metal chilate compounds.

In the organic electroluminescent apparatus according to the present invention, when the voltage amplitude of the electric signal in a pulse shape applied between the hole injection electrode and the electron injection electrode from the voltage applying means is changed, light is emitted in different colors in one organic electroluminescent device.

In the organic electroluminescent apparatus in the present invention, when the pulse time width of the electric signal in a pulse shape applied between the hole injection electrode and the electron injection electrode from the voltage applying means is changed, the luminance in the organic electroluminescent device is changed.

When only the pulse time width of the electric signal in a pulse shape applied between the hole injection electrode and the electron injection electrode from the voltage applying means is thus changed, it is possible to adjust only the luminance of light emitted from the organic electroluminescent device without changing the color thereof.

In the organic electroluminescent apparatus according to the present invention, when the voltage amplitude and the pulse time width of the electric signal in a pulse shape applied between the hole injection electrode and the electron injection electrode from the voltage applying means are changed, the emission spectrum and the luminance in the organic electroluminescent device are changed.

By thus adjusting the voltage amplitude and the pulse time width of the electric signal in a pulse shape applied between the hole injection electrode and the electron injection electrode from the voltage applying means, the color and the luminance of light emitted from the organic electroluminescent device are simply adjusted. Even when light is emitted in different colors in the organic electroluminescent device, therefore, the luminance of the light can be made constant.

In changing the voltage amplitude and the pulse time width of the electric signal in a pulse shape applied between the hole injection electrode and the electron injection electrode from the voltage applying means, there are provided pulse generating means for changing the pulse time width of the electric signal in a pulse shape and pulse voltage amplitude modulating means for changing the voltage amplitude of the electric signal in a pulse shape.

When the voltage amplitude and the pulse time width of the electric signal in a pulse shape applied between the hole injection electrode and the electron injection electrode from the voltage applying means are changed, it is preferable to change the pulse time width of the electric signal in a pulse shape by the pulse generating means and then change the voltage amplitude of the electric signal in a pulse shape by the pulse voltage amplitude modulating means. Consequently, useless consumption of power becomes lower, as compared with that in a case where the voltage amplitude of the electric signal in a pulse shape is changed by the pulse voltage amplitude modulating means, and the pulse time width of the electric signal in a pulse shape is then changed by the pulse generating means.

In the organic electroluminescent apparatus according to the present invention, it is possible to combine the organic electroluminescent device using the luminescent material in which the emission spectrum varies depending on the voltage of the electric signal applied between the hole injection electrode and the electron injection electrode as described above with another light emitting device emitting light in a different color from that of light emitted by the organic electroluminescent device.

When the organic electroluminescent device using the luminescent material in which the emission spectrum varies depending on the voltage of the electric signal applied between the hole injection electrode and the electron injection electrode is combined with the other light emitting device emitting light in a different color from that of light emitted by the organic electroluminescent device, light is emitted in various colors by adjusting the light emission in the organic electroluminescent device and the other light emitting device. When one organic electroluminescent device capable of emitting light in green to red as described above and the other light emitting device emitting light in blue are combined with each other, full-color display can be performed.

In the organic electroluminescent apparatus according to the present invention, it is preferable that a plurality of organic electroluminescent devices using a luminescent material in which the emission spectrum varies depending on the voltage of the electric signal applied between the hole injection electrode and the electron injection electrode are provided integrally with switching elements each composed of a thin film field-effect transistor. Further, it is preferable that the plurality of other organic electroluminescent devices emitting light in a different color from that of light emitted by the organic electroluminescent device are provided integrally with the switching elements each composed of a thin film field-effect transistor.

When the plurality of organic electroluminescent devices are thus provided integrally with the switching elements each composed of a thin film field-effect transistor, it is possible to simply carry out control in causing each of the organic electroluminescent devices to emit light, and miniaturize the organic electroluminescent apparatus.

There and other objects, advantages and features of the invention will become apparent from the following description thereof taken in conjunction with the accompanying drawings which illustrate specific embodiment of the invention.

DESCRIPTION OF THE PREFERRED EMBODIMENTS

Organic electroluminescent devices and organic electroluminescent apparatuses according to embodiments of the present invention will be specifically described on the basis of the accompanying drawings.

(Embodiment 1)

Figure 1:
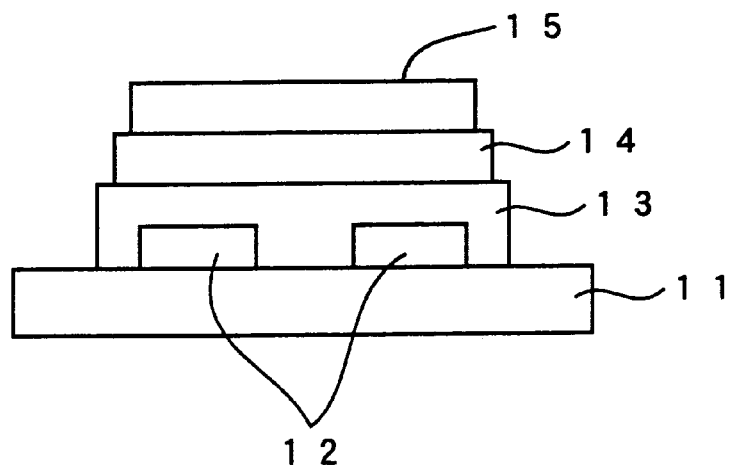
FIG. 1 is a schematic explanatory view showing the structure of an organic electroluminescent device in embodiments 1 and 2 of the present invention.

In an organic electroluminescent device 10 in an embodiment 1, a plurality of hole injection electrodes 12 in a line shape having a width of 2 mm and having a thickness of 200 nm are formed using the above-mentioned ITO on a glass substrate 11, as shown in FIG. 1.

On the glass substrate 11 having the plurality of hole injection electrodes 12 thus formed thereon, a hole transporting layer 13, having a thickness of 55 nm, composed of N,N'-diphenyl-N'N-bis(3-methylphenyl)-1,1-biphenyl-4,4'-diamine (hereinafter referred to as TPD) indicated by the following chemical formula 1 and a luminescent layer 14, having a thickness of 55 nm, obtained by doping 3.5% by weight of a compound having cyclobuteneditium-1,3-diolate derivative indicated by the following chemical formula 3 in a host material composed of bis(10-hydroxybenzo[h]quinolinate) beryllium complex (hereinafter referred to as BeBq$_2$) indicated by the following chemical formula 2 are successively formed. Further, on the luminescent layer 14, a plurality of electron injection electrodes 15 in a line shape, having a width of 2 mm and having a thickness of 200 nm, composed of a magnesium-indium alloy (the weight ratio Mg:In=9:1) are formed in a direction perpendicular to the hole injection electrodes 12:

[Chemical formula 1]

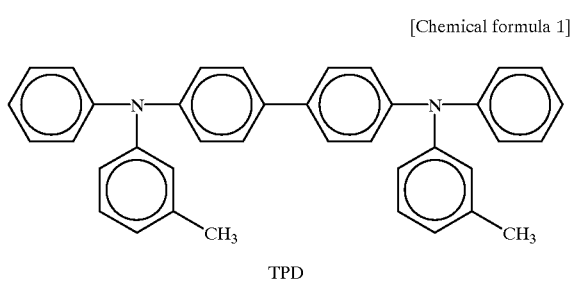

TPD

-continued

[Chemical formula 2]

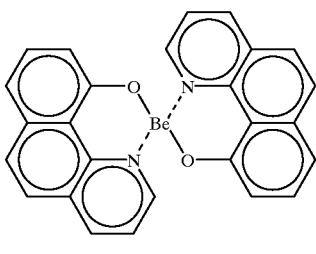

BeBq$_2$

[Chemical formula 3]

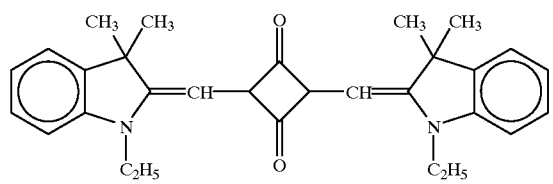

In fabricating the organic electroluminescent device 10, a transparent conductive film composed of ITO is formed by sputtering on the glass substrate 11, and is patterned using a hydrochloric acid solution containing FeCl$_3$, to form the plurality of hole injection electrodes 12 in a line shape having a width of 2 mm as described above.

The surfaces of the hole injection electrodes 12 thus formed on the glass substrate 11 are ground by an abrasive liquid, and are smoothed by removing fine projections on the surfaces of the hole injection electrodes 12. Thereafter, the glass substrate 11 is subjected to ultrasonic cleaning in 2-propanol for three minutes, and is then irradiated with ultraviolet lights having a wavelength of 185 nm to 370 nm in an atmosphere containing oxygen to decompose and remove impurities on the surfaces of the hole injection electrodes 12, to clean the surfaces of the hole injection electrodes 12.

The glass substrate 11 having the hole injection electrodes 12 whose surfaces are thus cleaned provided thereon is fixed in a vacuum tub of an evaporating device, the pressure of the vacuum tub is reduced to not more than $1\times10^{-4}$ Pa, a resistance heating board made of molibdenum is heated with the substrate temperature kept at 20° C. to 27° C., TPD indicated by the foregoing chemical formula 1 is evaporated, to form the hole transporting layer 13, and BeBq$_2$ indicated by the foregoing chemical formula 2 and the compound indicated by the foregoing chemical formula 3 are co-evaporated, to form the luminescent layer 14.

A mask made of stainless steel provided with a plurality of slits having a width of 2 mm is set with the glass substrate 11 having the luminescent layer 14 thus formed thereon maintained in a vacuum, and magnesium and indium are co-evaporated from above the mask, to form the plurality of electron injection electrodes 15 in a line shape having a width of 2 mm so as to be perpendicular to the hole injection electrodes 12.

In the organic electroluminescent device 10 in the embodiment 1, an area 2 mm square where the hole injection electrode 12 in a line shape and the electron injection electrode 15 in a line shape cross each other emits light.

In the organic electroluminescent device 10 in the embodiment 1, when a DC voltage of 12 volts was applied between the hole injection electrode 12 and the electron injection electrode 15 such that a potential at the hole injection electrode 12 would be positive, the density of a current flowing through the luminescent layer 14 was approximately 0.04 A/cm². Therefore, light in green based on BeBq₂, indicated by the foregoing chemical formula 2, having luminance of 2000 cd/m² and having an emission peak wavelength of 516 nm was emitted.

On the other hand, when a DC voltage of 7 volts was applied between the hole injection electrode 12 and the electron injection electrode 15, the density of a current flowing through the luminescent layer 14 was approximately 1 mA/cm². Therefore, light in red based on the compound, indicated by the foregoing chemical formula 3, having luminance of 40 cd/m² and having an emission peak wavelength of 670 nm was emitted.

When a DC voltage of 9.5 volts is applied between the hole injection electrode 12 and the electron injection electrode 15, the density of a current flowing through the luminescent layer 14 was approximately 0.01 A/cm². Therefore, light having an emission peak wavelength of 516 nm based on BeBq₂ indicated by the foregoing chemical formula 2 and light having an emission peak wavelength of 670 nm based on the compound indicated by the foregoing chemical formula 3 were simultaneously emitted, so that light in yellow having luminance of 400 cd/m² was emitted.

In the organic electroluminescent device 10 in the embodiment 1, the voltage applied between the hole injection electrode 12 and the electron injection electrode 15 was changed, to emit light in a plurality of colors from green to red on a chromaticity diagram in the one organic electroluminescent device 10.

The organic electroluminescent device 10 in the embodiment 1 is then used, and the electric signal in a pulse shape is applied between the hole injection electrode 12 and the electron injection electrode 15, to conduct experiments in which the voltage amplitude and the pulse time width of the electric signal in a pulse shape are changed.

EXPERIMENTAL EXAMPLE 1

In the experimental example, an electric signal composed of a square wave having a voltage amplitude of 12 volts from the maximum voltage of 12 volts to the minimum voltage of 0 volt and having a cycle period of one second, having a duty ratio of 0.004, and having a pulse time width of 4 milliseconds was applied between the hole injection electrodes 12 and the electron injection electrodes 15 such that a potential at the hole injection electrodes 12 would be positive.

In this case, green light having an emission peak wavelength of 516 nm and based on BeBq₂ indicated by the foregoing chemical formula 2 was emitted, and the average luminance thereof per second was 8 cd/m².

EXPERIMENTAL EXAMPLE 2

In the experimental example 2, an electric signal composed of a square wave having a voltage amplitude of 7 volts from the maximum voltage of 7 volts to the minimum voltage of 0 volts and having a cycle period of one second, having a duty ratio of 0.2, and having a pulse time width of 0.2 seconds was applied between the hole injection electrodes 12 and the electron injection electrodes 15 such that a potential at the hole injection electrodes 12 would be positive.

In this case, red light having an emission peak wavelength of 676 nm and based on the compound indicated by the foregoing chemical formula 3 was emitted, and the average luminance thereof per second was 8 cd/m².

EXPERIMENTAL EXAMPLE 3

In the experimental example 3, an electric signal composed of a square wave having a voltage amplitude of 9.5 volts from the maximum voltage of 9.5 volts to the minimum voltage of 0 volt and having a cycle period of one second, having a duty ratio of 0.02, and having a pulse time width of 0.02 seconds was applied between the hole injection electrodes 12 and the electron injection electrodes 15 such that a potential at the hole injection electrodes 12 would be positive.

In this case, light having an emission peak wavelength of 516 nm based on BeBq₂ indicated by the foregoing chemical formula 2 and light having an emission peak wavelength of 670 nm based on the compound indicated by the foregoing chemical formula 3 were simultaneously emitted, to emit yellow light, and the average luminance thereof per second was 8 cd/m².

As a result, when the voltage amplitude of the electric signal in a pulse shape applied between the hole injection electrode 12 and the electron injection electrode 15 was changed, and the pulse time width of the electric signal was changed, as shown in the above-mentioned experimental examples 1 to 3, light having constant average luminance was emitted in different colors from the organic electroluminescent device 10.

In the above-mentioned experimental examples 1 to 3, when the voltage amplitude of the electric signal in a pulse shape applied between the hole injection electrode 12 and the electron injection electrode 15 is increased, to emit light having a short wavelength, such control is carried out that the pulse time width of the electric signal is decreased, and such adjustment is made that the luminance of light emitted from the organic electroluminescent device 10 is not too large. On the other hand, when the voltage amplitude of the electric signal is decreased, to emit light having a long wavelength, such control is carried out that the pulse time width of the electric signal is increased, and such adjustment is made that the luminance of light emitted from the organic electroluminescent device 10 is increased. Although the luminance is thus made constant, light may be emitted by changing the luminance thereof.

When the voltage amplitude and the pulse time width of the electric signal in a pulse shape applied between the hole injection electrode 12 and the electron injection electrode 15 were further changed, which is not illustrated as an experimental example, light having constant average luminance was emitted in a desired color from green to red in the organic electroluminescent device 10 in the embodiment 1.

Although in the organic electroluminescent device 10 in the embodiment 1, in forming the luminescent layer 14, the mixture ratio of BeBq₂ indicated by the foregoing chemical formula 2 to the compound indicated by the foregoing chemical formula 3 is 96.5% by weight:3.5% by weight, the mixture ratio is not limited to the same. The percentage of the compound indicated by the foregoing chemical formula 3 is set in the range of 0.8% by weight to 14% by weight, and preferably in the range of 2% by weight to 6% by weight.

The molar mass of BeBq₂ indicated by the foregoing chemical formula 2 is 397 g/mol, and the molar mass of the compound indicated by the foregoing chemical formula 3 is 452 g/mol. The content of the compound indicated by the foregoing chemical formula 3 in the organic electroluminescent device 10 in the embodiment 1 is 3.1 mole % in fraction ratio.

(Embodiment 2)

An organic electroluminescent device 10 in an embodiment 2 is constructed similarly to the organic electroluminescent device 10 in the embodiment 1 except that only a luminescent layer 14 is changed.

In the organic electroluminescent device 10 in the embodiment 2, an example of the luminescent layer 14 is one, having a thickness of 40 nm, obtained by doping 2% by weight of tris(thenoyltrifluoroacetone)(1,10-phenanthroline)europium] (hereinafter referred to as EU(TTA)$_3$phen) indicated by the following chemical formula 5 in a host material composed of 1,3-bis[5-(p-tert-butylphenyl)-3,4-oxadiazol-2-yl]benzen (hereinafter referred to as OXD-7) indicated by the following chemical formula:

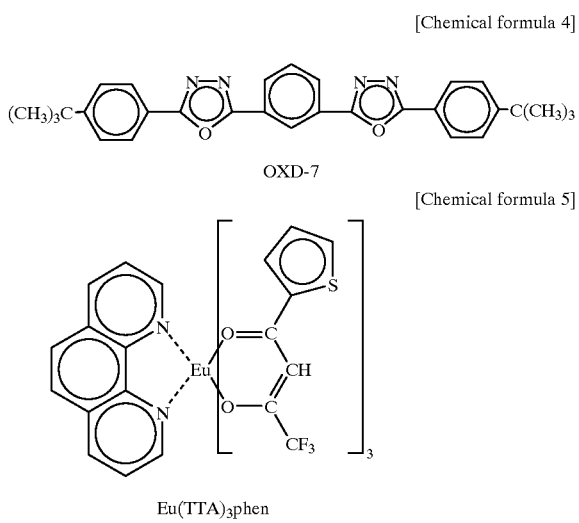

[Chemical formula 4]

OXD-7

[Chemical formula 5]

Eu(TTA)$_3$phen

In the organic electroluminescent device 10 in the embodiment 2, when a DC voltage of 19 volts was applied between a hole injection electrode 12 and an electron injection electrode 15 such that a potential at the hole injection electrode 12 would be positive, light in blue, based on the OXD-7 indicated by the foregoing chemical formula 4, having luminance of 600 cd/m$^2$ and having an emission peak wavelength of 465 nm was emitted.

When a DC voltage of 9 volts was applied between the hole injection electrode 12 and the electron injection electrode 15, light in red based on the Eu(TTA)$_3$phen, indicated by the foregoing chemical formula 5, having luminance of 20 cd/m$^2$ and having an emission peak wavelength of 614 nm was emitted.

When a DC voltage of 12 volts was applied between the hole injection electrode 12 and the electron injection electrode 15, light having an emission peak wavelength of 465 nm based of OXD-7 indicated by the foregoing chemical formula 4 and light having an emission peak wavelength of 614 nm based of Eu(TTA)$_3$phen indicated by the foregoing chemical formula 5 were simultaneously emitted, so that light in purplish red having luminance of 100 cd/m$^2$ was emitted.

In the organic electroluminescent device 10 in the embodiment 2, the voltage applied between the hole injection electrode 12 and the electron injection electrode 15 was changed, to emit light in a plurality of colors on a line connecting blue and red on a chromaticity diagram in the one organic electroluminescent device 10.

Although in the organic electroluminescent device 10 in the embodiment 2, in forming the luminescent layer 14, the mixture ratio of OXD-7 indicated by the foregoing chemical formula 4 to Eu(TTA)$_3$phen indicated by the foregoing chemical formula 5 was 98% by weight:2% by weight, the mixture ratio was not limited to the same. The percentage of the Eu(TTA)$_3$phen indicted by the foregoing chemical formula 5 is set to 0.4% by weight to 8% by weight, and preferably 1% by weight to 3.5% by weight.

The molar mass of OXD-7 indicted by the foregoing chemical formula 4 is 478 g/mol, and the molar mass of Eu(TTA)$_3$phen indicated by the foregoing chemical formula 5 is 995 g/mol. The content of Eu(TTA)$_3$phen indicated by the foregoing chemical formula 5 in the organic electroluminescent device 10 in the embodiment 2 is 0.97 mole % in fraction ratio.

(Embodiment 3)

Figure 2:
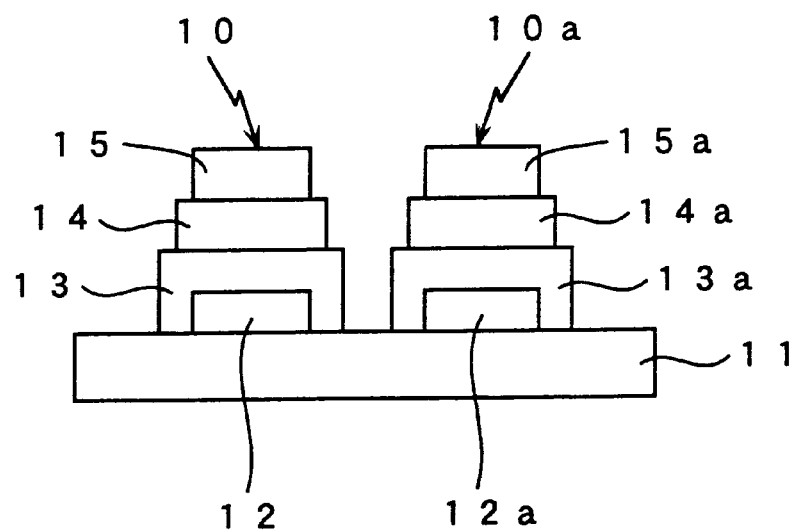
FIG. 2 is a schematic explanatory view showing a state where a first organic electroluminescent device emitting light in green to red and a second organic electroluminescent device emitting light in blue are provided in an embodiment 3 of the present invention.

In the present embodiment, a first organic electroluminescent device 10 emitting light in green to red is fabricated in the same manner as the organic electroluminescent device 10 in the embodiment 1, while a second organic electroluminescent device 10a emitting light in blue is fabricated adjacent to the first organic electroluminescent device 10, as shown in FIG. 2.

In fabricating the second organic electroluminescent device 10a, a hole transporting layer 13a, having a thickness of 55 nm, composed of TPD indicated by the forgoing chemical formula 1 and a luminescent layer 14a, having a thickness of 40 nm, composed of OXD-7 indicated by the foregoing chemical formula 4 are successively formed on a hole injection electrode 12a in a line shape formed on a glass substrate 11 common to the first organic electroluminescent device 10, and an electron injection electrode 15a, having a thickness of 200 nm, composed of a magnesium-indium alloy (weight ratio Mg:In=9:1) is formed on the luminescent layer 14a.

The first organic electroluminescent device 10 and the second organic electroluminescent device 10 thus formed are individually controlled. The first organic electroluminescent device 10 is caused to emit light in green to red, and the second organic electroluminescent device 10a is caused to emit light in blue, thereby making it possible to perform full-color display.

In order to efficiently inject holes into a hole transporting layer 13 from a hole injection electrode 12 in each of the organic electroluminescent devices 10, the absolute value of the difference between the energy level H[anode] of the highest occupied molecular orbital (hereinafter referred to as HOMO) in a material composing the hole injection electrode 12 and the energy level H[HIL] of HOMO in a material composing the hole transporting layer 13 is less than 1 eV, and more preferably not more than 0.7 eV.

In each of the organic electroluminescent devices 10, the ionization potential energy of ITO composing the hole injection electrode 12 is 4.7 eV. When the vacuum level is set to 0 eV, the energy level H[anode] of HOMO in the ITO is 4.7 eV. On the other hand, in each of the organic electroluminescent devices, the ionization potential energy of TPD indicted by the foregoing chemical formula 4 used for the hole transporting layer 13 is 5.37 eV, and the energy level H[HIL] of HOMO in TPD is 5.37 eV. The absolute value of the difference therebetween is 0.67 eV, so that holes are efficiently injected from the hole injection electrode 12 to the hole transporting layer 13.

In using a mixture of a plurality of luminescent materials as the luminescent material, when a luminescent material having carrier transporting properties is used as a main component, and a luminescent material in which a peak on the longest wavelength side of the emission spectrum caused by excitation of ultraviolet lights exists on the longer wavelength side than that in the luminescent material having carrier transporting properties is used as a sub-component, excitation energy is moved from the luminescent material having carrier transporting properties in an excited state to the other luminescent material which is a sub-component. In order that the other luminescent material which is a sub-component is efficiently excited, it is preferable that the difference in the peak wavelength on the longest wavelength side between the luminescent material having carrier transporting properties and the other luminescent material which is a sub-component is not less than 100 nm. Further, it is preferable that the band gap of the luminescent material having carrier transporting properties is larger than the band gap of the other luminescent material which is a sub-component, and the difference in the band gap therebetween is not less than 0.5 eV.

In a case where the luminescent material having electron transporting properties is used as a main component as described above, while the luminescent material at a low energy level is used as a sub-component, in order that the luminescent material which is a sub-component is sufficiently excited at a low voltage to sufficiently emit light, it is preferable that the difference in the energy level of LUMO between the luminescent material having electron transporting properties which is a main component and the luminescent material which is a sub-component is not less than 0.3 eV such that electrons injected into an organic layer including the luminescent materials are absorbed in the luminescent material which is a sub-component rather than the luminescent material having electron transporting properties which is a main component.

In the organic electroluminescent device 10 in the embodiment 1, the ionization potential energy of the above-mentioned $BeBq_2$ used as the luminescent material which is a main component is 55 eV and the band gap thereof is 2.6 eV, the energy level of LUMO in the $BeBq_2$ is 2.9 eV, and the wavelength of a peak on the longest wavelength side of the emission spectrum caused by excitation of ultraviolet lights in the $BeBq_2$ is 515 nm, while the ionization potential energy of the above-mentioned compound indicated by the chemical formula 3 used as the luminescent material which is a sub-component is 5.0 eV and the band gap thereof is 1.8 eV, the energy level of LUMO in the compound is 3.2 eV, and the wavelength of a peak on the longest wavelength side of the emission spectrum caused by excitation of ultraviolet lights in the compound is 670 nm. These values satisfy the above-mentioned conditions.

In the organic electroluminescent device 10 in the embodiment 2, the ionization potential energy of the above-mentioned OXD-7 used as the luminescent material which is a main component is 5.00 eV and the band gap thereof is 3.71 eV, the energy level of LUMO in the OXD-7 is 1.29 eV, and the wavelength of a peak on the longest wavelength side of the emission spectrum caused by excitation of ultraviolet lights in the OXD-7 is 374 nm, while the ionization potential energy of the above-mentioned $Eu(TTA)_3phen$ used as the luminescent material which is a sub-component is 4.99 eV and the band gap thereof is 3.14 eV, the energy level of LUMO in the $Eu(TTA)_3phen$ is 1.85 eV, and the wavelength of a peak on the longest wavelength side of the emission spectrum caused by excitation of ultraviolet lights in the $Eu(TTA)_3phen$ is 614 nm. Also in this case, these values satisfy the above-mentioned conditions.

Consider a case where the luminescent material having electron transporting properties is used as a main component, while the luminescent material at a low energy level is used as a sub-component, as described above. In this case, in order that electrons are efficiently injected from the electron injection electrode 15 to the luminescent material at a low energy level used as a sub-component, it is preferable that the difference between the energy level of LUMO in the luminescent material which is a sub-component and the energy level of HOMO in the material composing the electron injection electrode 15 is small, and it is preferable that the difference in the energy level therebetween is not more than 1.9 eV.

In the organic electroluminescent device 10, the ionization potential energy of the magnesium-indium alloy composing the electron injection electrode 15 is 3.7 eV, and the energy level of HOMO in the magnesium-indium alloy is 3.7 eV. On the other hand, the energy level of LUMO in the compound indicated by the foregoing chemical formula 3 used as the luminescent material which is a sub-component is 3.2 eV in the organic electroluminescent device 10 in the embodiment 1, and the energy level of LUMO in the $Eu(TTA)_3phen$ used as the luminescent material which is a sub-component is 1.85 eV in the organic electroluminescent device 10 in the embodiment 2. In either case, these values satisfy the above-mentioned conditions.

(Embodiment 4)

Figure 3:
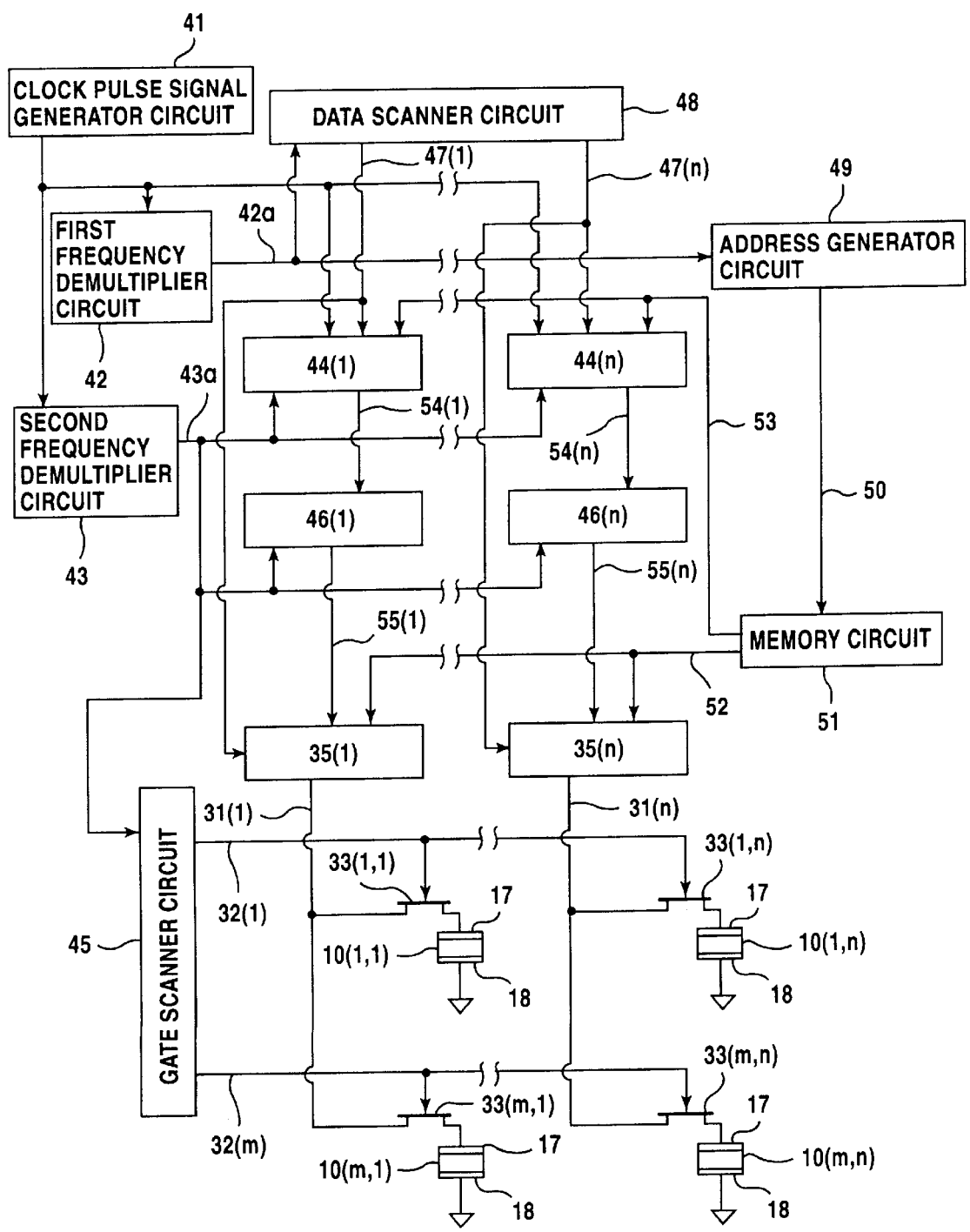
FIG. 3 is a schematic explanatory view of an organic electroluminescent apparatus in an embodiment 4 of the present invention.

In an organic electroluminescent device in the present embodiment, organic electroluminescent devices 10 are arranged in a matrix of m rows by n columns, as shown in FIG. 3, where m and n are arbitrary natural numbers.

In the present embodiment, n data lines 31 for supplying an electric signal for driving the organic electroluminescent devices 10 arranged in a matrix of m rows by n columns are provided in correspondence with the columns of the organic electroluminescent devices 10, and m gate scanning lines 32 for selecting pixels are provided so as to be perpendicular to the data lines 31 in correspondence with the rows of the organic electroluminescent devices 10, as shown in FIG. 3.

In each of intersections of the data lines 31 and the gate scanning lines 32, a switching element 33 is provided in correspondence with each of the organic electroluminescent devices 10. Each of the switching elements 33 is connected to a pixel electrode 17 constituting one electrode in each of the organic electroluminescent devices 10, while the other electrodes in the organic electroluminescent devices 10 are a common electrode 18.

n pulse voltage amplitude modulators 35 for outputting a signal whose pulse voltage amplitude is modulated are respectively provided in correspondence with the data lines 31, and the pulse voltage amplitude modulators 35 are respectively connected to the corresponding data lines 31.

In the organic electroluminescent apparatus, the gate scanning lines in the first row to the m-th row are successively selected and made active, so that only the switching elements 33 connected to the gate scanning line 32 in the row which have been selected and made active are turned on.

On the other hand, signals are respectively fed to the organic electroluminescent devices 10 in the first column to the n-th column connected to the rows of the switching elements 33 which are thus turned on from the corresponding pulse voltage amplitude modulators 35 in the first column to the n-th column through the data lines 31 in correspondence with the organic electroluminescent devices 10.

Consider a case where an arbitrary column between the first column to the n-th column is indicated as a (i) column, an arbitrary row between the first row to the m-th row is indicated as a (j) row, and an intersection of the j-th row and the i-th column is indicted by (j,i). In this case, when the gate scanning line 32(j) in the j-th row is selected and made active, only the switching elements 33(j,1) to 33(j,n) in the j-th row which are connected to the gate scanning line 32(j) in the j-th row are turned on.

Output signals are respectively applied to the organic electroluminescent devices 10(j,1) to 10(j,n) in the j-th row connected to the switching elements 33(j,1) to 33(j,n) in the j-th row which are thus turned on from the pulse voltage amplitude modulators 35(1) to 35(n) in the first to n-th columns through the data lines 31(1) to 31(n).

The gate scanning lines 32 in the first row to the m-th row are successively selected and made active, as described above, so that light emission in all the organic electroluminescent devices 10(1,1) to 10(m,n) in the organic electroluminescent apparatus is controlled. An image is displayed on the whole of the organic electroluminescent apparatus by performing scanning m times.

In the organic electroluminescent apparatus, the maximum emission time Te for which one of the organic electroluminescent devices 10 can emit light is a scanning period Tf in which the gate scanning lines 32 in the first row to the m-th row are successively selected and scanned by the number m of the gate scanning lines 32 to be scanned, that is, Te=Tf/m. In order to prevent an image obtained in the organic electroluminescent apparatus from flickering, it is preferable that the scanning period Tf is not more than 1/30 seconds. When the scanning period Tf is one second, and the number m of the gate scanning lines 32 is eight, the maximum emission time Te is 125 milliseconds.

A case where the organic electroluminescent apparatus in the present embodiment is driven will be specifically described on the basis of FIG. 3.

In the organic electroluminescent apparatus according to the present embodiment, a clock pulse signal which is a timing control signal in a pulse shape having a predetermined clock frequency Fc is generated in a clock pulse signal oscillator circuit 41.

A voltage of the clock pulse signal is so set as to be zero volt in an inactive state, while being +5 volts in an active state. The voltage of the clock pulse signal in the active state can be selected in the range of +3 volts to +15 volts.

A clock frequency Fc of the clock pulse signal is so set that it is the reciprocal of a time slice value Ts which is the minimum width for setting time in carrying out timing control, i.e., Ts=1/Fc. For example, when the clock frequency Fc is set to 10.0 kHz, the time slice value Ts is 0.100 milliseconds, so that timing control can be carried out in a time interval which is an arbitrary natural number times the time slice value Ts.

The other signals in the organic electroluminescent apparatus in the embodiment are controlled such that they are synchronized with the clock pulse signal.

The clock pulse signal is branched into three signals. Each of the three signals is inputted in parallel to all of a first frequency demultiplier circuit 42, a second frequency demultiplier circuit 43, and n pulse counter circuits 44(1) to 44(n).

When the second frequency demultiplier circuit 43 has an inherent count constant Cs, and repeats operations of outputting, when the count register value of the inputted clock pulse signal reaches the count constant Cs, a start pulse signal to a start pulse signal line 43a to make the outputted start pulse signal active, resetting the count register value to zero, then making the output state of the start pulse signal line 43 inactive, and counting the number of pulses of the clock pulse signal again.

The count constant Cs, together with the time slice value Ts, is set on the basis of Cs=Te/Ts such that the maximum emission time Te is a desired value. For example, when the maximum emission time Te is 125 milliseconds, and the time slice value Ts is 0.100 milliseconds, the count constant Cs is set to 1250.

A voltage of the start pulse signal is so set as to be zero volt in an inactive state, while being +5 volts in an active state. The voltage in the active state of the start pulse signal can be selected in the range of +3 volts to +15 volts, as in the case of the clock pulse signal.

The period of the start pulse signal is equal to the maximum emission time Te.

The start pulse signal is branched into three signals. Each of the three signals is inputted in parallel to all of a gate scanner circuit 45 to which the m gate scanning lines 32(1) to 32(m) are connected, the n pulse counter circuits 44(1) to 44(n), and n pulse generator circuits 46(1) to 46(n).

The gate scanner circuit 45 selects the one gate scanning line 32(j) out of the m gate scanning lines 32, and makes the selected gate scanning line active. To make the gate scanning line 32(j) active means carrying out such control that the voltage of the gate scanning line 32(j) is set to a predetermined voltage, and the switching elements 33(j,i) to 33(j,n) in the j-th row connected to the gate scanning line 32(j) are rendered conductive. The voltage of the gate scanning line 32(j) which is made active may be a voltage at which the switching elements 33(j,i) to 33(j,n) can be rendered conductive, as described above. The voltage is set in the range of +3 volts to +20 volts, and preferably in the range of +10 volts to +15 volts, and is set to +12 volts in the present embodiment.

When a new pulse of the start pulse signal is inputted to the gate scanner circuit 45, the gate scanning line 32(j) is made inactive upon releasing the selection thereof by the gate scanner circuit 45, and the subsequent gate scanning line 32 (j+1) adjacent to the gate scanning line 32(j) is made active upon being selected. To make the gate scanning line inactive means changing the voltage of the gate scanning line 32(j) such that the switching elements 33(j,i) to 33(j,n) are rendered non-conductive. Specifically, the voltage of the gate scanning line 32(j) is set in the range of +1 volt to −20 volts, preferably in the range of −5 volts to −15 volts, and −6 volts in the present embodiment.

The gate scanning lines 32 are successively made active, as described above. After the last m-th gate scanning line 32(m) is made active, the first gate scanning line 32(1) is selected. Even after that, the above-mentioned operations are repeated.

On the other hand, the first frequency demultiplier circuit 42 to which the clock pulse signal is inputted is a circuit for controlling a data transfer period Td so that the data transfer period Td and the relationship between the maximum emission time Te and the number of columns n satisfy the condition of Td<<Te/n.

The first frequency demultiplier circuit 42 has an inherent count constant Cd, and repeats operations of counting the number of pulses of the inputted clock pulse signal, outputting a data transfer signal to a data transfer signal line 42a to make the outputted data transfer signal active when the count register value of the pulses reaches the count constant Cd, and resetting the count register value to zero, then making the output state of the data transfer signal line 42*a* inactive, and counting the number of pulses of the data transfer signal again.

A voltage of the data transfer signal is so set as to be zero volt in an inactive state, while being +5 volts in an active state. The voltage in the active state of the data transfer signal can be selected in the range of +3 volts to +15 volts, as in the case of the clock pulse signal and the start pulse signal.

The data transfer period Td is found by Td=Ts·Cd from the time slice value Ts and the count constant. The count constant Cd is set to the largest natural number which does not exceed the count constant Cs of the second frequency demultiplier circuit 43 divided by the number n of the data lines 31 such that the data transfer period Td satisfies the condition of Td<<Te/n. When the count constant Cs of the second frequency demultiplier circuit 43 is 1250, and the number n of the data lines 31 is 40, for example, the count constant Cd is set to 31. When the time slice value Ts is 0.100 milliseconds, the data transfer period Td is 3.1 milliseconds.

The data transfer signal is branched into two signals. The two signals are inputted as timing signals to the data scanner circuit 48 and the address generator circuit 49.

The address generator circuit 49 is connected to a memory circuit 51 by an address bus 50. Information relating to chromaticity and luminance corresponding to a pixel composed of each of the organic electroluminescent devices 10 are stored in the memory circuit 51 upon being converted into information relating to the voltage amplitude and the pulse time width of a pulse. A voltage amplitude data bus 52 and a pulse time width data bus 53 are connected to the output side of the memory circuit 51.

When the data transfer signal is inputted to the address generator circuit 49, a predetermined address value is outputted to the address bus 50 from the address generator circuit 49, and the address value is inputted to the memory circuit 51 through the address bus 50.

When the address value is inputted to the memory circuit 51, information relating to the voltage amplitude of a pixel corresponding to the address value is outputted to the voltage amplitude data bus 52 from the memory circuit 51, and information relating to the pulse time width of the pixel corresponding to the address value is outputted to the pulse time width data bus 53.

The voltage amplitude data bus 52 is connected in parallel to all of the n pulse voltage amplitude modulators 35(l) to 35(n), and the pulse time width data bus 53 is connected in parallel to all of the n pulse counter circuits 44(l) to 44(n).

When a new pulse of a data transfer signal is inputted to the address generator circuit 49, the address value is increased by one, and is outputted to the address bus 50. The address value has m×n values in correspondence with the organic electroluminescent devices 10(1,l) to 10(m,n).

The address bus 50 can be constituted by digital signal lines. The number of the digital signal lines composing the address bus 50 is determined by the number of address values. In the case of the h digital signal lines, address values whose number corresponds to $2^h$ can be represented. In order to represent m×n address values, the smallest natural number satisfying $h \geq \log_2 (m \cdot n)$ may be set as h. In the case of n=40 and m=8, h may be not less than nine, so that the address bus 50 may be constituted by the nine digital signal lines.

On the other hand, n signal enable lines 47(l) to 47(n) are connected to the output side of the data scanner circuit 48 to which the data transfer signal is inputted. The signal enable lines 47(l) to 47(n) are respectively connected to the corresponding n pulse counter circuits 44(l) to 44(n) and the corresponding n pulse voltage amplitude modulators 35(l) to 35(n).

When the data transfer signal is inputted to the data scanner circuit 48, the data scanner circuit 48 selects the signal enable line 47(i) which is one of the n signal enable lines 47(l) to 47(n), and makes the selected signal enable line 47(i) active.

When a new pulse of the data transfer signal is inputted to the data scanner circuit 48, the signal enable line 47(i) is made inactive upon releasing the selection thereof, while the subsequent signal enable line 47(i+1) adjacent to the signal enable line 47(i) is made active upon being selected.

The signal enable lines 47 are thus successively made active. When a new pulse of the data transfer signal is inputted after the last n-th signal enable line 47(n) is made active, the first signal enable line 47(l) is selected. Even after that, the above-mentioned operations are repeated.

A voltage of the signal enable line 47 is so set as to be zero volt in an inactive state, while being +5 volts in an active state. The voltage in the active state of the signal enable line 47 can be selected in the range of +3 volts to +15 volts, as in the case of the clock pulse signal or the like.

The pulse counter circuits 44(l) to 44(n) are circuits for controlling the respective pulse time widths Tw. On the output side of the pulse counter circuits 44(l) to 44(n), corresponding stop pulse signal lines 54(l) to 54(n) are respectively connected. The stop pulse signal lines 54(l) to 54(n) are respectively connected to the corresponding pulse generator circuits 46(l) to 46(n).

Each of the pulse counter circuits has a pulse time width count variable Vw which can be arbitrarily changed. When the signal enable line 47 connected to each of the pulse counter circuits 44 is made active, a value subsequent to the corresponding pulse time width count variable Vw is accepted from the pulse time width data bus 53, and is held in an internal register.

Each of the pulse counter circuits 44 counts the number of pulses of the clock pulse signal inputted from the clock pulse signal oscillator circuit 41, outputs, when the count register value reaches the pulse time width count variable Vw currently set, a stop pulse signal for making the corresponding stop pulse signal line 54 active, resets the count register value thereof to zero, and then makes the output state of the stop pulse signal line 54 inactive.

A voltage of the stop pulse signal is so set as to be zero volt in an inactive state, while being +5 volts in an active state. The voltage in the active state of the stop pulse signal can be selected in the range of +3 volts to +15 volts, as in the case of the clock pulse signal or the like.

When the output state of the stop pulse signal line 54 is made inactive, as described above, the pulse counter circuit 44 accepts the value of the subsequent pulse time width count variable Vw held in the internal register as described above, and sets the pulse time width count variable Vw to a new pulse number count variable Vw, to wait until a new pulse of the start pulse signal is inputted from the second frequency demultiplier circuit 43 through the start pulse signal line 43*a*.

When the new pulse of the start pulse signal is inputted from the second frequency demultiplier circuit 43 through the start pulse signal line 43a, the number of pulses of the clock pulse signal is counted again, to repeat the above-mentioned operations.

On the other hand, on the output sides of the pulse generator circuits 46(1) to 46(n), corresponding width modulated pulse signal lines 55(1) to 55(n) are respectively connected. The width modulated pulse signal lines 55(1) to 55(n) are respectively connected to the corresponding pulse voltage amplitude modulators 35(1) to 35(n).

Each of the pulse generator circuits 46 changes, when a new pulse of the start pulse signal is inputted from the second frequency demultiplier circuit 43 through the start pulse signal line 43a, the output state of the width modulated pulse signal line 55 from an inactive state to an active state, and holds the output state of the width modulated pulse signal line 55 in the active state until the corresponding stop pulse signal line 54 is made active.

Each of the pulse generator circuits 46 changes, when the output state of the corresponding stop pulse signal line 54 is changed from an inactive state to an active state, the output state of the corresponding width modulated pulse signal line 55 from an active state to an inactive state, and holds the output state of the width modulated pulse signal line 55 in the inactive state until a new pulse of the start pulse signal is inputted from the second frequency demultiplier circuit 43.

The width modulated pulse signal outputted from the width modulated pulse signal line 55 is so set as to be zero volt in an inactive state, while being set to +5 volts in an active state. The voltage of the width modulated pulse signal in a case where the output state of the width modulated pulse signal line 55 is made active can be selected in the range of +3 volts to +15 volts, as in the case of the clock pulse signal or the like.

In the above-mentioned manner, the rise of the width modulated pulse signal outputted to each of the width modulated pulse signal lines 55 connected to the pulse generator circuits 46 from an inactive state to an active state is synchronized with the start pulse signal inputted from the second frequency demultiplier circuit 43. Therefore, the width modulated pulse signals outputted from all the width modulated pulse signal lines 55 rise to an active state all at time.

On the other hand, the rise of the width modulated pulse signal outputted to each of the width modulated pulse signal lines 55 connected to the pulse generator circuits 46 from an active state to an in active state differs depending on the current value of the pulse time width count variable Vw set in the corresponding pulse counter circuit 44. The pulse time width Tw in which the width modulated pulse signal outputted from each of the width modulated pulse signal lines 55 is made active is the product of the time slice value Ts and the pulse time width count variable Vw, that is, Tw=Ts·Vw.

Each of the pulse voltage amplitude modulators 35 connected in correspondence with the width modulated pulse signal lines 55 has a voltage amplitude variable Va which can be arbitrarily changed. When the signal enable line 47 connected in correspondence with the voltage amplitude variable Va is made active, a value subsequent to the value of the voltage amplitude variable Va is accepted from the voltage amplitude data bus 52, and is held in an internal register.

When each of the width modulated pulse signal lines 55 is changed from an inactive state to an active state, as described above, so that the width modulated pulse signal is inputted from each of the width modulated pulse signal lines 55 to the corresponding pulse voltage amplitude modulator 35, the inputted width modulated pulse signal is amplified depending on the current voltage amplitude variable Va held in the pulse voltage amplitude modulator 35, is converted into an electric signal for driving the organic electroluminescent device 10, and is outputted to the corresponding data line 31. A voltage outputted to each of the data lines 31 is controlled in the range of 0 volt to +20 volts.

On the other hand, when the output state of the width modulated pulse signal line 55 is changed from an active state to an inactive state, the pulse voltage amplitude modulator 35 connected to the width modulated pulse signal line 55 stops the output state of the corresponding data line 31, accepts the value of the subsequent voltage amplitude variable Va held in the internal register, as described above, and sets the voltage amplitude variable Va to a new voltage amplitude variable Va, to wait until a new width modulated pulse signal is inputted upon change of the width modulated pulse signal line 55 from an inactive state to an active state. Thereafter, the same operations are repeated.

The voltage amplitude data bus 52 and the pulse time width data bus 53 can be constituted by one or more digital signal lines. When k digital signal lines are used for the voltage amplitude data bus 52 and the pulse time width data bus 53, it is possible to represent hue and luminance in stages corresponding to $2^k$.

The voltage amplitude data bus 52 and the pulse time width data bus 53 can be also constituted by one analog signal line. In this case, information relating to the voltage amplitude and the pulse time width are represented by the value of a voltage or a current. For example, it is possible to use, as the pulse voltage amplitude modulator 35, a voltage control pulse voltage amplitude modulator circuit in which the voltage amplitude variable Va is controlled by a voltage of the voltage amplitude data bus 52, and it is possible to use, as the pulse counter circuit 44, an analog-to-digital converter circuit for converting a voltage of the pulse time width data bus 53 into the value of the pulse time width count variable Vw.

A clock pulse signal generated in the clock pulse signal oscillator circuit 41 as describe above becomes a timing control signal. The organic electroluminescent devices 10 in respective rows are successively selected, as described above, so that an image is displayed on the whole of the organic electroluminescent apparatus.

An example in which in the organic electroluminescent apparatus according to the present embodiment, switching elements 33 each composed of a thin film field-effect transistor (hereinafter referred to as TFT) using polysilicon, amorphous silicon, or the like are provided in correspondence with the organic electroluminescent devices 10 will be described on the basis of FIG. 4.

A transparent conductive film composed of ITO is first formed on a glass substrate 61 such that the thickness thereof is in the range of 0.1 $\mu$m to 1 $\mu$m. In the present embodiment, the thickness of the transparent conductive film is set to 0.3 $\mu$m.

Figure 4:
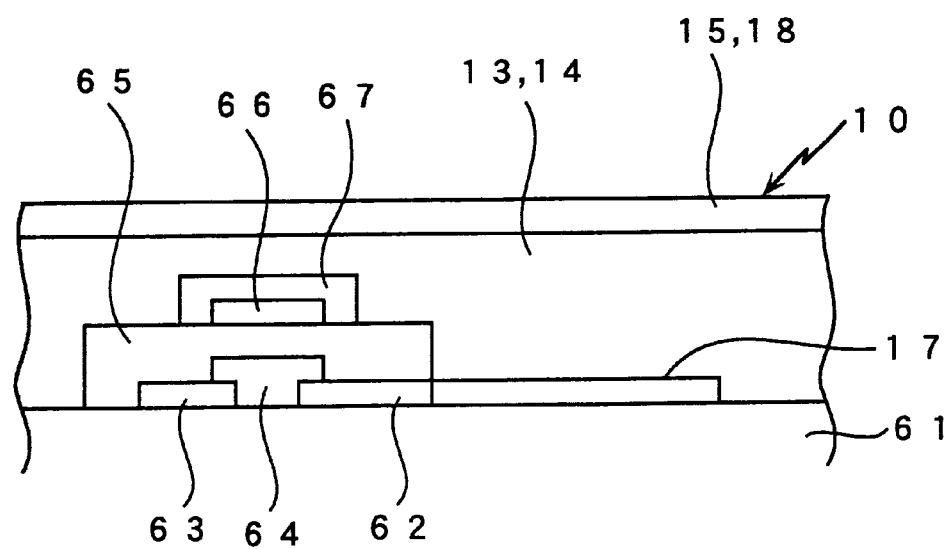
FIG. 4 is a schematic explanatory view showing an example in which a switching element using a thin film field-effect transistor is provided in correspondence with an organic electroluminescent device in the organic electroluminescent apparatus according to the embodiment 4.

The transparent conductive film is patterned using photoresist, and is etched using a hydrochloric acid solution containing $FeCl_3$, for example, to integrally provide a source electrode 62 and a pixel electrode 17 in the organic electroluminescent device 10, as shown in FIG. 4, on the glass substrate 61, and form a drain electrode 63 and a drain line (not shown) connected to the drain electrode 63.

The pixel electrode 17 is used as the hole injection electrode 12 in the organic electroluminescent device 10 as shown in FIG. 1, and the drain line is used as the data line 31.

In order to then form a channel portion of the TFT between the source electrode 62 and the drain electrode 63, an amorphous silicon film is grown thereon by plasma CVD or the like such that the thickness thereof is in the range of 0.20 µm to 0.30 µm, and is patterned, to form an island 64. In the present embodiment, the thickness of the amorphous silicon film is set to 0.25 µm.

A resist film is formed so as to cover the pixel electrode 17. An insulating layer having a thickness in the range of 0.20 am to 0.50 µm is formed using silicon dioxide $SiO_2$ on the resist film, the source electrode 62, the drain electrode 63, and the island 64. In the present embodiment, the thickness of silicon dioxide $SiO_2$ is set to 0.40 µm.

The insulating layer on the pixel electrode 17 is removed by lift-off, to expose the pixel electrode 17, while a gate insulating film 65 is formed so as to cover the source electrode 62, the drain electrode 63, and the island 64.

A gate electrode 66 having a thickness in the range of 0.20 µm to 0.30 µm is then formed in a portion above the island 64 by electron beam heating vacuum evaporation, CVD, and the like using aluminum containing approximately 0 to 1% by weight of molybdenum, and a gate line serving as the above-mentioned gate scanning line 32 is so formed as to be connected to the gate electrode 66. In the present embodiment, the thickness of the gate electrode 66 is set to 0.25 µm.

A gate protective insulating film 67 composed of silicon dioxide $SiO_2$ is then formed such that the thickness thereof is in the range of 0.20 µm to 0.40 µm so as to cover the gate electrode 66. In the present embodiment, the thickness of the gate protective insulating film 67 composed of silicon dioxide $SiO_2$ is set to 0.30 µm.

An amorphous silicon film composing the island 64 may be denatured into a polysilicon film upon being heat-treated by a method of laser annealing or the like, or the switching elements 33 may be formed using another known method.

After the switching elements 33 using the TFT are thus formed on the glass substrate 61, a hole transporting layer 13 and a luminescent layer 14 are formed on the glass substrate 61 in the same manner as the organic electroluminescent devices 10 in the embodiment 1, and an electron injection electrode 15 composed of a material having a small ionization potential, for example, an alloy of magnesium and indium is formed thereon. The electron injection electrode 15 is used as the above-mentioned common electrode 18. An electron transporting layer may be provided between the luminescent layer 14 and the electron injection electrode 15.

In arranging the pixel electrode 17 on the surface of the glass substrate 61, the pixel electrodes 17 are successively provided such that a pitch will be 98 µm, for example, and the area of each of the pixel electrodes 17 is set to 7.86× $10^{-5}$ cm².

As the DC characteristics of the switching elements 33, it is preferable that the value of a current flowing through the drain electrode 63 is not less than 60 µA in a case where a potential at the source electrode 62 is 0 volt, a potential at the drain electrode 63 is +15 volts, and a potential at the gate electrode 66 is +15 volts. On the other hand, it is preferable that the value of a current flowing through the drain electrode 63 is not more than 5 pA in a case where a potential at the source electrode is 0 volt, a potential at the drain electrode 63 is +10 volts, and a potential at the gate electrode 66 is −6 volts.

As the switching characteristics of the switching elements 33, it is preferable that a rise time Tr at the time of switching from an OFF state to an ON state is not more than one-tenth the maximum emission time Te, and it is preferable that the rise time Tr is not more than $Te/(2 \cdot g)$ in a case where the hue and the luminance of a pixel are represented in g stages.

Description is now made of a case where the organic electroluminescent apparatus in which the switching elements 33 using the TFT are formed on the glass substrate 61 as described above, and the organic electroluminescent devices 10 in the embodiment 1 are fabricated is driven, to cause the organic electroluminescent devices 10 to emit light in green to red.

When each of the organic electroluminescent devices 10 is caused to emit light in green to red, to display characters, the reproducibility of subtle colors cannot be generally found. Therefore, description is now made of a case where only four colors, that is, green, yellow, orange, and red are represented.

In this case, the voltage amplitude data bus 52 can be constituted by two digital signal lines, so that light in green, light in yellow, light in orange, and light in red are respectively emitted when the value of the voltage amplitude variable Va accepted by each of the pulse voltage amplitude modulators 35 from the voltage amplitude data bus 52 is 3, 2, 1, and 0.

When the organic electroluminescent devices 10 are caused to emit light in green by setting the value of the voltage amplitude variable Va to 3, such control is carried out that the amplitude of a voltage outputted to the data line 31 from the pulse voltage amplitude modulator 35 will be +12 volts. When the organic electroluminescent devices 10 are caused to emit light such that the luminance will be 5 cd/m², the pulse time width Tw is set to 2.5 milliseconds. When the time slice value Ts is set to 0.100 milliseconds, the value of the pulse time width count variable Vw is set to 25 in order that the pulse time width Tw will be 2.5 milliseconds.

In order that the luminance in the organic electroluminescent devices 10 is Xcd/m², the pulse time width Tw is adjusted in accordance with an equation of Tw (msec)=2.5× X/5.

When the organic electroluminescent devices 10 are caused to emit light in yellow by setting the value of the voltage amplitude variable Va to 2, such control is carried out that the voltage amplitude outputted to the data line 31 from the pulse voltage amplitude modulator 35 will be +9.5 volts. When the organic electroluminescent devices 10 are caused to emit light such that the luminance will be 5 cd/m², the pulse time width Tw is set to 12.5 milliseconds. When the time slice value Ts is set to 0.100 milliseconds, the value of the pulse time width count variable Vw is set to 125 in order that the pulse time width Tw will be 12.5 milliseconds.

In order that the luminance in the organic electroluminescent devices 10 is Xcd/m², the pulse time width Tw is adjusted in accordance with an equation of Tw (msec)= 12.5×X/5.

When the organic electroluminescent devices 10 are caused to emit light in orange by setting the value of the voltage amplitude variable Va to 1, such control is carried out that the amplitude of a voltage outputted to the data line 31 from the pulse voltage amplitude modulator 35 will be +8.5 volts. When the organic electroluminescent devices 10 are caused to emit light such that the luminance will be 5 cd/m², the pulse time width Tw is set to 40 milliseconds. When the time slice value Ts is set to 0.100 milliseconds, the value of the pulse time width count variable Vw is set to 400 in order that the pulse time width Tw will be 40 milliseconds.

In order that the luminance in the organic electroluminescent devices 10 is Xcd/m², the pulse time width Tw is adjusted in accordance with an equation of Tw (msec)=40× X/5.

When the organic electroluminescent devices 10 are caused to emit light in red by setting the value of the voltage amplitude variable Va to 0, such control is carried out that the amplitude of a voltage outputted to the data line 31 from the pulse voltage amplitude modulator 35 will be +7.0 volts. When the organic electroluminescent devices 10 are caused to emit light such that the luminance will be 5 cd/m², the pulse time width Tw is set to 0.125 milliseconds. When the time slice value Ts is set to 0.100 milliseconds, the value of the pulse time width count variable Vw is set to 1250 in order that the pulse time width Tw will be 0.125 seconds.

In order that the luminance in the organic electroluminescent devices 10 is Xcd/m², the pulse time width Tw is adjusted in accordance with an equation Tw (msec)=0.125× X/5.

When the pulse time width data bus 53 is composed of 11 digital signal lines, the value of the pulse time width count variable Vw can take integers 0 to 2047. For example, when the organic electroluminescent devices 10 are caused to emit light in green by setting the value of the voltage amplitude variable Va to 3, the pulse time width count variable Vw can take integers 0 to 25, so that luminance in at least 26 stages can be represented. In order to subtly represent the luminance, the time slice value Ts may be made smaller, and the number of digital signal lines composing the pulse time width data bus 53 may be increased.

Although the present invention has been fully described by way of example, it is to be noted that various changes and modification will be apparent to those skilled in the art.

Therefore, unless otherwise such changes and modifications depart from the scope of the present invention, they should be construed as being included therein.

What is claimed is:

1. An organic electroluminescent device, comprising
   an organic layer including luminescent materials in which the emission spectrum varies depending on a voltage of an electric signal applied between a hole injection electrode and an electron injection electrode, wherein
   said luminescent materials comprising a luminescent material having carrier transporting properties and a luminescent material in which a peak on the longest wavelength side of the emission spectrum caused by excitation of ultraviolet lights exists on the longer wavelength side than that in said luminescent material having carrier transporting properties.

2. The organic electroluminescent device according to claim 1, wherein
   the difference in the peak wavelength between said luminescent material having carrier transporting properties and the luminescent material in which the peak on the longest wavelength side of the emission spectrum caused by excitation of ultraviolet lights exists on the longer wavelength side than that in the luminescent material having carrier transporting properties is not less than 100 nm.

3. The organic electroluminescent device according to claim 1, wherein
   a luminescent layer and a hole transporting layer provided between the luminescent layer and the hole injection electrode are provided as the organic layer,
   the luminescent material having carrier transporting properties in said luminescent layer being a luminescent material having electron transporting properties, and the thickness of the luminescent layer being smaller than the thickness of the hole transporting layer.

4. The organic electroluminescent device according to claim 1, wherein
   the luminescent materials in the organic layer are obtained by doping a rare earth complex in a host material.

5. The organic electroluminescent device according to claim 4, wherein
   the amount of the doped rare earth complex is in the range of 0.4 to 8% by weight of the host material.

6. The organic electroluminescent device according to claim 1, wherein
   the luminescent materials in the organic layer are obtained by doping a compound having cyclobuteneditium-1,3-diolate derivative in a host material containing a beryllium complex.

7. The organic electroluminescent device according to claim 1, wherein
   the luminescent materials in the organic material are obtained by doping a europium complex in a host material containing an oxadiazole derivative.

8. An organic electroluminescent device, comprising
   an organic layer including luminescent materials in which the emission spectrum varies depending on a voltage of an electric signal applied between a hole injection electrode and an electron injection electrode, wherein
   said luminescent materials comprising a luminescent material having electron transporting properties and a luminescent material in which the energy level of the lowest unoccupied molecular orbital is lower than that in said luminescent material having electron transporting properties.

9. The organic electroluminescent device according to claim 8, wherein
   the difference in said energy level of the lowest unoccupied molecular orbital between the luminescent material having electron transporting properties and a luminescent material in which the energy level of the lowest unoccupied molecular orbital is lower than that in said luminescent material having electron transporting properties is not less than 0.3 eV.

10. The organic electroluminescent device according to claim 8, wherein
    the luminescent materials in the organic layer are obtained by doping a rare earth complex in a host material.

11. The organic electroluminescent device according to claim 10, wherein
    the amount of the doped rare earth complex is 0.4 to 8% by weight of the host material.

12. An organic electroluminescent apparatus, comprising
    an organic electroluminescent device having an organic layer including a luminescent material in which the emission spectrum varies depending on a voltage of an electric signal provided between a hole injection electrode and an electron injection electrode; and
    a voltage applying device for applying a voltage of an electric signal in a pulse shape between the hole injection electrode and the electron injection electrode,
    the voltage applying device changing the voltage amplitude of the electric signal in a pulse shape applied between the hole injection electrode and the electron injection electrode, to change the emission spectrum in the organic electroluminescent device.

13. The organic electroluminescent apparatus according to claim 12, wherein said voltage applying device changes the pulse time width of the electric signal in a pulse shape applied between the hole injection electrode and the electron injection electrode, to change the luminance in the organic electroluminescent device.

14. The organic electroluminescent apparatus according to claim 12, wherein the pulse time width of the electric signal in a pulse shape is changed by a pulse generating device, and the voltage amplitude of the electric signal in a pulse shape is then changed by a pulse voltage amplitude modulating device.

15. The organic electroluminescent apparatus according to claim 12, wherein said luminescent material includes a luminescent material having carrier transporting properties and a luminescent material in which a peak on the longest wavelength side of the emission spectrum caused by excitation of ultraviolet lights exists on the longer wavelength side than that in the luminescent material having carrier transporting properties.

16. The organic electroluminescent apparatus according to claim 12, wherein said luminescent material includes a luminescent material having electron transporting properties and a luminescent material in which the energy level of the lowest unoccupied molecular orbital is lower than that in the luminescent material having electron transporting properties.

17. The organic electroluminescent apparatus according to claim 12, wherein the organic electroluminescent device having an organic layer including a luminescent material in which the emission spectrum varies depending on a voltage of an electric signal provided between the hole injection electrode and the electron injection electrode is combined with another light emitting device emitting light in a different color from that of light emitted by the organic electroluminescent device.

18. The organic electroluminescent apparatus according to claim 17, wherein the organic electroluminescent device emits light in a plurality of colors from green to red in accordance with a chromaticity diagram and said another light emitting device emitting light in a different color emits light in blue.

19. The organic electroluminescent apparatus according to claim 17, wherein the organic electroluminescent device emits light in a plurality of colors from blue to red in accordance with a chromaticity diagram and said another light emitting device emitting light in a different color emits light in green.

20. The organic electroluminescent apparatus according to claim 12, wherein the organic electroluminescent devices are respectively provided integrally with switching elements.

* * * * *